(12) United States Patent
Liu

(10) Patent No.: US 9,024,269 B2
(45) Date of Patent: May 5, 2015

(54) HIGH YIELD COMPLEMENTARY METAL-OXIDE SEMICONDUCTOR X-RAY DETECTOR

(71) Applicant: General Electric Company, Schenectady, NY (US)

(72) Inventor: James Zhengshe Liu, Salt Lake City, UT (US)

(73) Assignee: General Electric Company, Schenectady, NY (US)

( * ) Notice: Subject to any disclaimer, the term of this patent is extended or adjusted under 35 U.S.C. 154(b) by 218 days.

(21) Appl. No.: 13/728,299

(22) Filed: Dec. 27, 2012

(65) Prior Publication Data
US 2014/0183676 A1 Jul. 3, 2014

(51) Int. Cl.
*G01T 1/20* (2006.01)
*H01L 31/18* (2006.01)
*H01L 27/146* (2006.01)

(52) U.S. Cl.
CPC .............. *G01T 1/2018* (2013.01); *H01L 31/18* (2013.01); *H01L 27/14663* (2013.01)

(58) Field of Classification Search
CPC .................. G01T 1/2018; H01L 27/14663
USPC ......................... 250/370.11, 370.09
See application file for complete search history.

(56) References Cited

U.S. PATENT DOCUMENTS

| | | | | |
|---|---|---|---|---|
| 7,263,165 | B2 * | 8/2007 | Ghelmansarai | 378/98.8 |
| 2009/0224162 | A1 * | 9/2009 | Inuiya et al. | 250/370.09 |
| 2011/0147596 | A1 * | 6/2011 | Ishida et al. | 250/366 |
| 2011/0284749 | A1 * | 11/2011 | Okada | 250/361 R |
| 2013/0207960 | A1 * | 8/2013 | Argues et al. | 345/212 |

* cited by examiner

*Primary Examiner* — David Porta
*Assistant Examiner* — Mindy Vu

(57) ABSTRACT

A digital X-ray detector includes a scintillator that is configured to absorb radiation emitted from an X-ray radiation source and to emit light photons in response to the absorbed radiation. The detector also includes a complementary metal-oxide-semiconductor (CMOS) light imager that is configured to absorb the light photons emitted by the scintillator. The CMOS light imager includes a first surface and a second surface. The first surface is disposed opposite the second surface. The scintillator contacts the first surface of the CMOS light imager. The CMOS light imager further includes a CMOS pixel array with an array of CMOS pixels. Each individual CMOS pixel includes at least two row select transistors.

18 Claims, 3 Drawing Sheets

HIGH YIELD COMPLEMENTARY METAL-OXIDE SEMICONDUCTOR X-RAY DETECTOR

BACKGROUND OF THE INVENTION

The subject matter disclosed herein relates generally to an X-ray detector, and more particularly to a digital complementary metal-oxide-semiconductor (CMOS) X-ray detector with a high manufacturing yield.

The use of digital X-ray imaging systems continues to become increasingly invaluable with respect to a variety of technical applications. Digital X-ray imaging systems are a mainstay in the medical field allowing health care professionals to quickly diagnose and treat internal abnormalities of their patients. Additionally, their use has become increasingly important in industrial fields for visualizing internal contents of parts, baggage, parcels, and other objects, and for visualizing the contents and structural integrity of objects and for other purposes. Indeed, the evolution of digital X-ray detectors has enhanced both workflow and image quality of digital X-ray imaging systems.

Generally, X-ray imaging involves the generation of X-rays that are directed toward an object of interest. The X-rays pass through and around the object and then impact an X-ray film, X-ray cassette, or digital X-ray detector. In the context of the digital X-ray detector, X-ray photons traverse a scintillator that converts the X-ray photons to visible light, or light photons. The light photons then collide with a detector array that includes photosensing elements and electronic components that convert the light photons into electrical signals which are processed as digital image data and into digital images that can be viewed, stored, and/or transmitted electronically. As digital X-ray detectors continue to replace conventional X-ray film and X-ray cassettes, the need for improving the efficiency and image quality of digital X-ray imaging remains at the forefront.

The evolution of digital X-ray detectors has included the development of CMOS based digital X-ray detectors. Digital CMOS X-ray detectors are drawing more attention and becoming more popular in the area of fluoroscopic X-ray imaging especially in surgical and interventional applications because they exhibit extremely low electronic noise. However, one of the problems associated with digital CMOS X-ray detectors are their high cost compared to traditional amorphous silicon based digital X-ray detectors. The high cost of the digital CMOS X-ray detectors is due to a low manufacturing yield. A key failure mode that impacts the manufacturing yield of these detectors is defective lines in the CMOS detector arrays that create image artifacts in resulting images.

The subject matter of this disclosure greatly reduces the number of defective lines, improves the manufacturing yield of CMOS detector arrays, and reduces the cost of CMOS detector arrays, resulting in improved manufacturing yield and reduced cost of digital CMOS X-ray detectors.

BRIEF DESCRIPTION OF THE INVENTION

In accordance with one embodiment, a digital X-ray detector is provided. The detector includes a scintillator that is configured to absorb radiation emitted from an X-ray radiation source and to emit light photons in response to the absorbed radiation. The detector also includes a complementary metal-oxide-semiconductor (CMOS) light imager that is configured to absorb the light photons emitted by the scintillator. The CMOS light imager includes a first surface and a second surface. The first surface is disposed opposite the second surface, and the scintillator contacts the first surface of the CMOS light imager. The CMOS light imager further includes a CMOS pixel array with an array of CMOS pixels. Each individual CMOS pixel includes at least two row select transistors.

In accordance with another embodiment, a detector array is provided. The detector array includes a scintillator that is configured to absorb radiation emitted from an X-ray radiation source and to emit light photons in response to the absorbed radiation. The detector also includes a complementary metal-oxide-semiconductor (CMOS) light imager that is configured to absorb the light photons emitted by the scintillator. The scintillator contacts the CMOS light imager. The CMOS light imager includes a CMOS pixel array with an array of CMOS pixels. Each individual CMOS pixel includes redundant double row select transistors.

In accordance with a further embodiment, a method is provided for assembling a digital X-ray detector. The method includes depositing a scintillator onto a first surface of a complementary metal-oxide-semiconductor (CMOS) light imager. The scintillator contacts the CMOS light imager. The CMOS light imager includes a CMOS pixel array with an array of CMOS pixels. Each individual CMOS pixel includes a first row select transistor connected in series to a second row select transistor. The method also includes enclosing the scintillator and CMOS light imager within an outer cover.

The brief descriptions set forth above are exemplary and not intended to be limiting, and combinations or alternate embodiments thereof are considered to be within the scope of the present disclosure.

BRIEF DESCRIPTION OF THE DRAWINGS

These and other features, aspects, and advantages of the disclosed subject matter will become better understood when the following detailed description is read with reference to the accompanying drawings in which like characters represent like parts throughout the drawings, wherein.

DETAILED DESCRIPTION OF THE INVENTION

Figure 1:
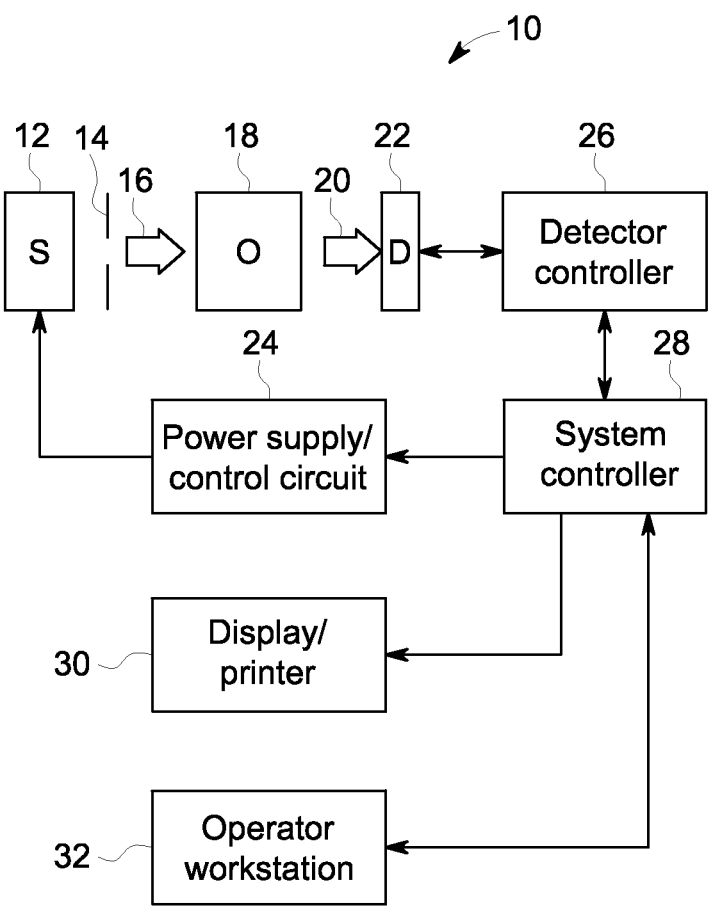
FIG. 1 is a block diagram of an exemplary embodiment of a digital X-ray imaging system.

Referring to the drawings, FIG. 1 illustrates a block diagram of an exemplary embodiment of a digital X-ray imaging system 10 for acquiring original image data and processing the image data for display. The digital X-ray imaging system 10 includes an X-ray radiation source 12 positioned adjacent to a collimator 14. The collimator 14 permits a stream of X-ray radiation 16 to pass into a region in which an object or subject 18 is positioned.

A portion of the X-ray radiation 20 passes through or around the object or subject 18 and impacts a digital X-ray detector 22. In certain embodiments, the detector 22 may include a complementary metal-oxide-semiconductor (CMOS) based detector. As will be appreciated by those skilled in the art, the digital X-ray detector 22 may convert the X-ray radiation photons received on its surface to lower energy light photons, and subsequently to electric signals, which are acquired and processed to reconstruct an image of the features within the object or subject.

The X-ray radiation source 12 is controlled by a power supply/control circuit 24 which supplies both power and control signals for examination sequences. Moreover, the digital X-ray detector 22 is communicatively coupled to a detector controller 26 which commands acquisition of the signals generated in the detector 22. In certain embodiments, the detector 22 may communicate with the detector controller 26 via any suitable wireless communication standard, although the use of digital X-ray detectors 22 that communicate with the detector controller 26 through a cable, tether or some other mechanical connection are also envisaged. The detector controller 26 may also execute various signal processing and filtration functions, such as for initial adjustment of dynamic ranges, interleaving of digital image data, and so forth.

Both the power supply/control circuit 24 and the detector controller 26 are responsive to signals from a system controller 28. In general, the system controller 28 commands operation of the imaging system to execute examination protocols and to process acquired image data. In the present context, the system controller 28 also includes signal processing circuitry, typically based upon a programmed general purpose or application-specific digital computer, associated memory circuitry, such as optical memory devices, magnetic memory devices, or solid-state memory devices, for storing programs and routines executed by a processor of the computer to carry out various functionalities, as well as for storing configuration parameters and image data, interface circuits, and so forth.

In the embodiment illustrated in FIG. 1, the system controller 28 is linked to at least one output device, such as a display or printer 30. The output device may include standard or special purpose computer monitors and associated processing circuitry. One or more operator workstations 32 may be further linked in the system for selecting system parameters, requesting examinations, viewing images, and so forth. In general, displays, printers, workstations, and similar devices supplied within the system may be local to the data acquisition components, or may be remote from these components, such as elsewhere within an institution or medical facility, or in an entirely different location, linked to the image acquisition system via one or more configurable networks, such as the Internet, virtual private networks, and so forth.

The digital X-ray imaging system 10 as shown in FIG. 1 may also include a variety of alternative embodiments generally configured to meet the particular needs of certain applications. In certain embodiments, the digital X-ray imaging system 10 may be a fixed or mobile radiography system, a tomosynthesis system, a fluoroscopy system, a computed tomography (CT) system, or any combination thereof. As examples, the digital X-ray imaging system 10 may be a fixed radiography or tomosynthesis system where the digital X-ray detector 22 is either permanently mounted together with the system or portable for positioning in a table or wall stand, a mobile radiography system where the digital X-ray detector 22 is portable or tethered, a fixed fluoroscopy system where the digital X-ray detector 22 is permanently mounted within the system, or a mobile fluoroscopy system where the digital X-ray detector 22 is permanently positioned opposite of the X-ray radiation source 12.

Throughout the following discussion, while basic and background information is provided on the digital X-ray imaging system used in medical diagnostic applications, it should be born in mind that aspects of the present subject matter may be applied to digital X-ray detectors used in different settings (e.g., projection imaging, computed tomography imaging, and tomosynthesis imaging, etc.) and for different purposes (e.g., parcel, baggage, component, and part inspection, etc.).

Figure 2:
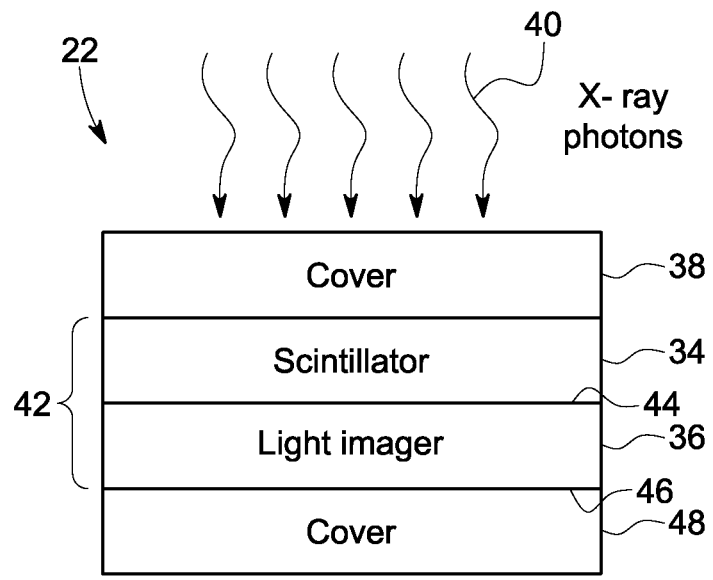
FIG. 2 is a cross-sectional schematic view of an exemplary embodiment of a digital complementary metal-oxide-semiconductor (CMOS) X-ray detector.

FIG. 2 illustrates a cross-sectional schematic view of an exemplary embodiment of the digital CMOS X-ray detector 22 that includes a scintillator 34 disposed directly on a light imager 36 (e.g., a CMOS light imager). Directly depositing the scintillator 34 on the light imager 36 may improve the detective quantum efficiency (DQE) of the detector. The components of the detector 22 illustrated may represent only some of the components present in such detection systems. For example, these detectors 22 may include electronics and an outer cover 38 and 48. As discussed herein, the digital X-ray detector 22 includes a detector array 42 that includes the scintillator 34 and the light imager 36 (e.g., a CMOS light imager). In addition, the CMOS light imager 36 includes a photosensitive area or pixel array. The scintillator may be fabricated from suitable scintillator compositions such as Cesium Iodide (CsI).

The light imager 36 includes a first surface 44 (e.g., the top surface) and a second surface 46 (e.g., the bottom surface) opposite from the first surface 44. The scintillator 34 is directly disposed on the first surface 44 of the light imager 36.

The scintillator 34 converts X-ray photons 40 to light photons. The light imager 36 converts the light photons to electric signals for acquiring and processing image data. Generally, X-ray photons 40 are emitted from an X-ray radiation source 12, traverse the area in which an object or subject 18 is positioned, and collide with the scintillator 34 within the digital X-ray detector 22. The scintillator 34 absorbs the X-ray photons 40 and emits lower energy light photons that are proportional to the energy and amount of X-ray photons absorbed. As such, light emissions will be higher in those regions of the scintillator 34 where more X-ray photons were received. Since the composition of the object or subject 18 will attenuate the X-ray photons projected by the X-ray radiation source 12 to varying degrees, the energy level and amount of X-ray photons 40 colliding with the scintillator 34 will not be uniform across the scintillator 34. This non-uniformity results in a variation of light emission that will be used to generate contrast in a reconstructed image of the object or subject being imaged.

After the X-ray photons 40 are converted to light photons by the scintillator 34, the resulting light photons emitted by the scintillator 34 are detected by a photosensitive area in the CMOS light imager 36. The photosensitive area may include an array of photosensing elements or pixels to store an electric charge in proportion to the quantity of incident light absorbed by the respective photosensing elements. Generally, each photosensing element has a light sensing region and an electronically-controlled region for the storage and output of electric charge from that photosensing element. The light sensing region may be composed of a photodiode, which absorbs light and subsequently creates and stores an electric charge. After an X-ray exposure, the electric charge in each photodiode is read out and processed by the digital X-ray imaging system 10.

To protect the detector array 42 from light contamination and to provide structural support, an outer cover 38, 48 may be placed around the scintillator 34 and CMOS light imager 36 as shown in FIG. 2. In an exemplary embodiment, the outer cover may include two separate pieces, a first cover 38 and a second cover 48 in a sandwich configuration for enclosing the scintillator 34 and CMOS light imager 36 therebetween. The first cover 38 may be positioned on a top surface of the scintillator 34 and the second cover 48 may be positioned on a bottom surface of the light imager 36. In an exemplary embodiment, the first cover 38 and the second cover 48 may be a single piece that encloses the scintillator 34 and CMOS light imager 36 therein. In certain embodiments, the first and second covers 38, 48 may be fabricated from carbon fiber, metal, metal alloy, plastic, a composite material or other suitable material.

In certain embodiments, light photons emitted from the scintillator 34 may travel towards the first cover 38 instead of the CMOS light imager 36. To redirect the light photons, the detector array 42 may include a light reflector, comprised of silver or other suitable light reflective material, disposed on a surface (e.g., a top surface) of the scintillator 34 opposite the light imager 36. The light reflector is designed to reflect light photons from the scintillator 34 back towards the CMOS light imager 36 resulting in less quantum noise, a stronger light signal, and more efficient overall performance of the digital X-ray detector 22.

In order to block moisture contamination, the digital X-ray detector 22 may include a moisture blocking layer and a sealing material. In certain embodiments, the moisture blocking layer or moisture blocking material (e.g., aluminum film) may be disposed between the outer cover 38, 48 and the detector array 42. In particular, a first moisture blocking layer may be disposed between the first cover 38 and the scintillator 34 or light reflector, and a second moisture blocking layer may be disposed between the light imager 36 and the second cover 48. In certain embodiments, a suitable waterproof sealing material may be disposed around the outer edges of the detector array 42 to seal the components of the detector array 42, including the scintillator 34, light imager 36, and a light reflector disposed on a surface (e.g., a top surface) of the scintillator 34.

Figure 3:
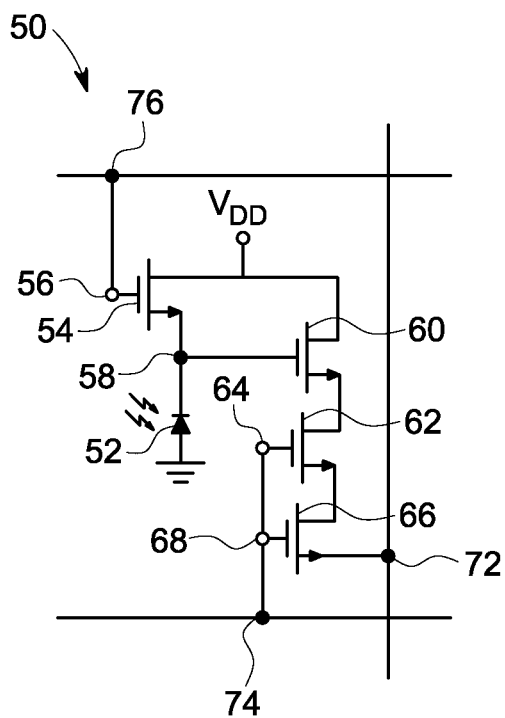
FIG. 3 is a schematic diagram of an exemplary embodiment of a high yield CMOS pixel within a pixel array of a digital CMOS X-ray detector.

FIG. 3 illustrates a schematic diagram of an exemplary embodiment of a high yield CMOS pixel 50 within a pixel array of a digital CMOS X-ray detector. The high yield CMOS pixel 50 includes a photodiode 52, a reset gate 56 on a reset transistor 54, a charge amplifier gate 58 on an charge amplifier transistor 60, a first row select gate 64 on a first row select transistor 62, and a second row select gate 68 on a second row select transistor 66. The high yield CMOS pixel 50 is accessed by a common column data line 72, a row select scan line 74, and a reset line 76.

The cathode of the photodiode 52 is electrically coupled to the charge amplifier node 58, which is electrically coupled to the source of the reset transistor 54 and the gate of the charge amplifier transistor 60. The anode of the photodiode 52 is electrically coupled to ground. The drains of the reset transistor 54 and the charge amplifier transistor 60 are electrically coupled to a supply voltage VDD. The source of the charge amplifier transistor 60 is electrically coupled to the drain of the first row select transistor 62. The source of the first row select transistor 62 is electrically coupled to the drain of the second row select transistor 66. The reset gate 56 is electrically coupled to the reset line 76. The common column data line is electrically coupled to the source of the second row select transistor 66. The first row select gate 64 and the second row select gate 68 are electrically coupled to the row select scan line 74.

In certain embodiments, a CMOS pixel may include three or four transistors, depending on the pixel structure. A three transistor CMOS pixel configuration includes a photodiode, a charge amplifier transistor, a reset transistor, and a row select transistor. Operation of a three transistor CMOS pixel includes X-ray photons being converted into light photons by a scintillator and the light photons being converted into electrons by the photodiode and accumulated as electrical charge. The electrical charge is amplified by the charge amplifier transistor and fed onto a common column data line to be read out through the row select transistor. The purpose of the reset transistor is to clear the electrical charge after it is read out.

A four transistor CMOS pixel configuration includes a photodiode, a transfer gate coupled between the photodiode and a floating diffusion node, a charge amplifier transistor, a reset transistor, and a row select transistor. Compared to the three transistor configuration, the four transistor configuration has less electronic noise and better linearity. The lower electronic noise is achieved in the four transistor configuration by implementing correlated double sampling. Because of variation of the supply voltage VDD, photodiodes may be set to different potentials after reset, which introduces noise known as reset noise. Reset noise is one of the major contributors of the electronic noise in digital CMOS X-ray detectors. In the four transistor CMOS pixel configuration, reset noise may be eliminated by turning on the transfer gate during reset so that the reset noise is transferred and stored in the floating diffusion node. After reset, the transfer gate is turned off and the floating diffusion node is insulated from the photodiode. When the image data is read out, the reset noise stored in the floating diffusion is sampled first. The signal in the photodiode is transferred to the floating diffusion node and is sampled second. The reset noise is then subtracted from the signal. The pixel readout process contains two correlated samplings hence is called correlated double sampling.

As is shown in FIG. 3, the row select transistor in a typical three transistor CMOS pixel is replaced by two row select transistors, a first row select transistor 62 and a second row select transistor 66 that are connected in series. This is done in order to prevent two row select gates, a first row select gate 64 and a second row select gate 68, from being shorted together by a dust particle or some other particle. In the CMOS pixel configuration of the present disclosure, the first row select transistor 62 and the second row select transistor 66 are located far apart from each other on the semiconductor die that a particle is not large enough to short two row select gates together. This is feasible since the area of a pixel in a digital CMOS X-ray detector is usually several hundred times greater than the area of a CMOS sensor in a digital camera.

By using two row select gates, a first row select gate 64 and a second row select gate 68, the possibility of shorting a CMOS pixel to its common column data line 72 is greatly reduced. Thus, the occurrence of column data line defects is greatly reduced and may be even eliminated. This is critical to improving the manufacturing yield of digital CMOS X-ray detectors since the detector array can usually tolerant thousands of isolated defective CMOS pixels but only a very limited number of defective data lines. Often, a detector panel must be scraped if it includes a single defective data line.

Figure 4:
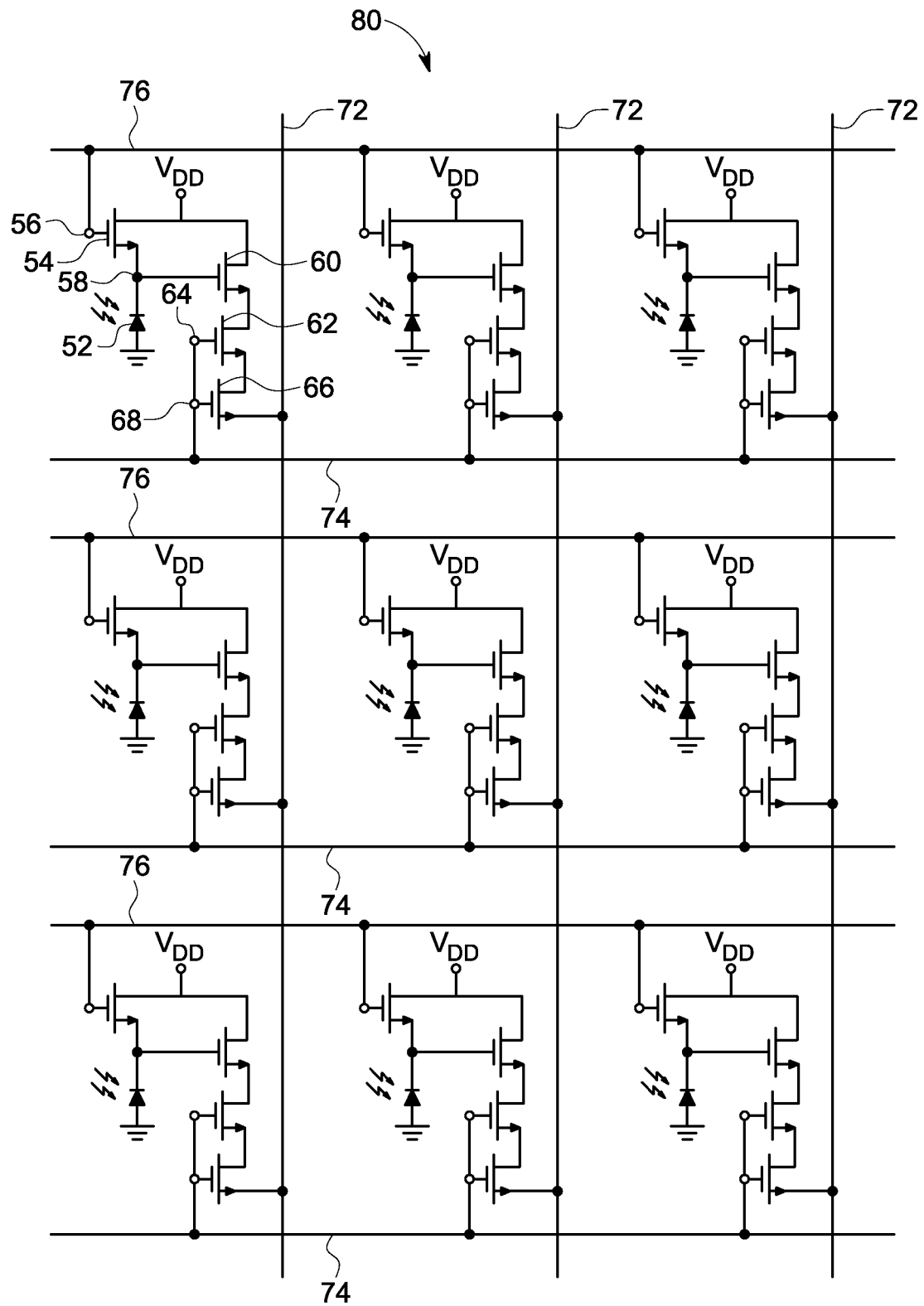
FIG. 4 is a schematic diagram of an exemplary embodiment of a high yield CMOS pixel array within a digital CMOS X-ray detector.

FIG. 4 illustrates a schematic diagram of an exemplary embodiment of a high yield CMOS pixel array 80 within a digital CMOS X-ray detector. The high yield CMOS pixel array 80 includes an array of individual CMOS pixels 50 in an x-y grid allowing the pixels to be accessed individually. The high yield CMOS pixel array 80 includes an array of individual CMOS pixels 50 with redundant double row select transistors 62, 66. The redundant double row select transistors 62, 66 include a first row select transistor 62 that is connected in series to a second row select transistor 66. In particular, a first row select gate 64 is electrically coupled to a second row select gate 66, and the first and second row select gates 64, 66 are electrically coupled to a row select scan line 74. The source of the first row select transistor 62 is electrically coupled to the drain of the second row select transistor 66, and the source of the second row select transistor 66 is electrically coupled to a common column data line 72.

The accessibility of the individual high yield CMOS pixels 50 in the CMOS pixel array 80 is achieved via a row select scan line 74 and a common column data line 72. The row select scan line 74 is used to address one row at a time while the common column data line 72 is used to address one column at a time. The common column data line 72 sequentially addresses all of the columns during the period when their row is being addressed by the row select scan line 74.

The common column data line 72 connects the output of all the CMOS pixels 50 in the same column of the CMOS pixel array 80 through the redundant double row select gates 64, 68. The redundant double row select gates 64, 68 disconnect all CMOS pixels except the selected CMOS pixel. The row select scan line 74 is used to select the desired row of CMOS pixels to be read out. Similarly, the reset line 76 is used to reset all of the CMOS pixels in a row.

During manufacturing of the CMOS light imager, there may be defects in the CMOS pixel array due 80 to, for instance, dust particles or other particles in the cleanroom of the CMOS fabrication facility. For example, if the row select gate of a CMOS pixel is shorted by a dust particle or other particle, the CMOS pixel with the shorted row select gate will always be connected to the common column data line 72 no matter if the CMOS pixel is selected by the row select scan line or not, which results in a defective common column data line that creates image artifacts in the resulting images.

In accordance with a method of assembly, the digital CMOS X-ray detector 22 as shown in FIG. 2, may be assembled by directly depositing a scintillator 34 onto a first or top surface of a CMOS light imager 36, resulting in a detector array 42. A first cover 38, such as a carbon fiber cover, may be positioned on the top of the scintillator 34 of the detector array 42 and a second cover 48, such as a carbon fiber cover, may be positioned on the bottom of the light imager 36 of the detector array 42 resulting in an assembly configuration as depicted in FIG. 2.

The technical advantage of the subject matter of this disclosure is that it greatly reduces the number of defective lines in CMOS detector arrays, improves the manufacturing yield of CMOS detector arrays, and reduces the cost of CMOS detector arrays, resulting in improved manufacturing yield and reduced cost of digital CMOS X-ray detectors.

This written description uses examples to disclose the present subject matter, including the best mode, and also to enable any person skilled in the art to practice the present approaches, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A digital X-ray detector comprising:
    a scintillator configured to absorb radiation emitted from an X-ray radiation source and to emit light photons in response to the absorbed radiation; and
    a complementary metal-oxide-semiconductor (CMOS) light imager configured to absorb the light photons emitted by the scintillator, wherein the CMOS light imager comprises a first surface and a second surface, wherein the first surface is disposed opposite the second surface, and the scintillator contacts the first surface of the CMOS light imager;
    wherein the CMOS light imager comprises a CMOS pixel array with an array of CMOS pixels, wherein each individual CMOS pixel comprises at least two row select transistors; and
    wherein the at least two row select transistors are connected in series.

2. The digital X-ray detector of claim 1, wherein the scintillator comprises cesium-iodide (CsI).

3. The digital X-ray detector of claim 1, comprising a first cover positioned on a top surface of the scintillator.

4. The digital X-ray detector of claim 3, comprising a second cover positioned on a bottom surface of the CMOS light imager.

5. The digital X-ray detector of claim 4, wherein one or both of the first or second covers comprises a carbon fiber, metal, metal alloy, plastic, composite material, or a combination thereof.

6. The digital X-ray detector of claim 4, wherein the first and second covers comprise a single piece that encloses the scintillator and CMOS light imager therein.

7. The digital X-ray detector of claim 1, wherein the at least two row select transistors are electrically coupled to a common column data line of the CMOS pixel array.

8. The digital X-ray detector of claim 1, wherein each of the at least two row select transistors include a row select gate that that are electrically coupled together and electrically coupled to a row select scan line of the CMOS pixel array.

9. A detector array comprising:
    a scintillator configured to absorb radiation emitted from an X-ray radiation source and to emit light photons in response to the absorbed radiation; and
    a complementary metal-oxide-semiconductor (CMOS) light imager configured to absorb the light photons emitted by the scintillator, wherein the scintillator contacts the CMOS light imager;
    wherein the CMOS light imager comprises a CMOS pixel array with an array of CMOS pixels, wherein each individual CMOS pixel comprises redundant double row select transistors; and
    wherein the redundant double row select transistors include a first row select transistor and a second row select transistor that are connected in series.

10. The detector array of claim 9, wherein the scintillator comprises cesium-iodide (CsI).

11. The detector array of claim 9, wherein the first and second row select transistors are electrically coupled to a common column data line of the CMOS pixel array.

12. The detector array of claim 9, wherein the first row select transistor includes a first row select gate and the second row select transistor includes a second row select gate, and wherein the first and second row select gates are electrically coupled together and electrically coupled to a row select scan line of the CMOS pixel array.

13. A method for assembling a digital X-ray detector comprising:
    depositing a scintillator onto a first surface of a complementary metal-oxide-semiconductor (CMOS) light imager, wherein the scintillator contacts the CMOS light imager; and
    enclosing the scintillator and CMOS light imager within an outer cover;
    wherein the CMOS light imager includes a CMOS pixel array with an array of CMOS pixels, wherein each individual CMOS pixel comprises a first row select transistor connected in series to a second row select transistor.

14. The method of claim 13, comprising disposing a first outer cover on a surface of the scintillator.

15. The method of claim 14, comprising disposing a second outer cover on a second surface of the CMOS light imager opposite from the first surface of the CMOS light imager contacting the scintillator.

16. The method of claim 15, wherein one or both of the first and second detector covers comprises a carbon fiber, metal, metal alloy, plastic, composite material, or a combination thereof.

17. The method of claim 13, wherein the first and second row select transistors are electrically coupled to a common column data line of the CMOS pixel array.

18. The method of claim 13, wherein the first row select transistor includes a first row select gate and the second row select transistor includes a second row select gate, and wherein the first and second row select gates are electrically coupled together and electrically coupled to a row select scan line of the CMOS pixel array.

\* \* \* \* \*